United States Patent [19]
Ohkawa et al.

[11] Patent Number: 5,492,080
[45] Date of Patent: Feb. 20, 1996

[54] CRYSTAL-GROWTH METHOD AND SEMICONDUCTOR DEVICE PRODUCTION METHOD USING THE CRYSTAL-GROWTH METHOD

[75] Inventors: Kazuhiro Ohkawa; Tsuneo Mitsuyu, both of Hirakata, Japan

[73] Assignee: Matsushita Electric Industrial Co., Ltd., Osaka, Japan

[21] Appl. No.: 360,642

[22] Filed: Dec. 21, 1994

[30] Foreign Application Priority Data

Dec. 27, 1993 [JP] Japan .................................. 5-330919
Apr. 18, 1994 [JP] Japan .................................. 6-078329

[51] Int. Cl.$^6$ ............................................. C30B 25/19
[52] U.S. Cl. ......................... 117/108; 117/956; 437/105
[58] Field of Search .................................. 117/108, 956; 437/105

[56] References Cited

U.S. PATENT DOCUMENTS 5,028,561  7/1991  Kamath et al. .......................... 437/105
5,057,183  10/1991  Tomomura et al. ..................... 117/108

FOREIGN PATENT DOCUMENTS 403110    12/1990  European Pat. Off. ............... 117/108
59-190295 12/1984  Japan .................................... 117/108
1279598   11/1989  Japan .
2285630   11/1990  Japan .................................... 117/108

OTHER PUBLICATIONS

Xie et al., Appl. Phys. Lett. 60(4), Jan. 1992, pp. 463–465, "Blue/Green pn Junction Electroluminescence From ZnSe–Based Multiple Quantum–Well Structures".
Ohkawa et al., Japanese Journal of Applied Physics, vol. 30, No. 2A, Feb. 1991, pp. L152–L155, "Characteristics of p–type ZnSe Layers Grown by Molecular . . . ".
Menda et al., Japanese Journal of Applied Physics, vol. 26, No. 8, Aug. 1987, pp. L1326–L1329, "RHEED Observation on (001) ZnSe Surface: MBE Surface Phase . . . ".
Park, J. Vac. Sci. Technol. A 10(4), Jul./Aug. 1992, "Low–Resistivity P–Type ZnSe:N Grown by Molecular Beam Epitaxy Using a Nitrogen Free–Radical Source".
Cheng et al., J. Vac. Sci. Technol. B8(2), Mar./Apr. 1990, "Molecular–Beam Epitaxy Growth of ZnSe Using a Cracked Selenium Source".
Yao, Researches of the Electrotechnical Laboratory, No. 854, Apr. 1985, "Molecular Beam Epitaxy of Zn–Chalcogenides".
Ohishi et al., Journal of Crystal Growth, vol. 117, pp. 125–128, 1992, "Low Temperature Growth of ZnSe/GaAs Using Hot Molecular Beams".
Ohkawa et al., J. Appl. Phys., 62(8), pp. 3216–3221, Oct. 1987, "Characteristics of Cl–Doped ZnSe Layers Grown by Molecular–Beam Epitaxy".
Okuyama et al, Journal of Crystal Growth, vol. 117, pp. 139–143, 1992, "Epitaxial Growth of ZnMgSSe on GaAs Substrate by Molecular Beam Epitaxy".
Itoh et al., Jpn. J. Appl. Phys., vol. 32, No. 10B, 1993, pp. L1530–L1532, "491–nm ZnCeSe/ZnSe/ZnMgSSe SCH Laser Diode With a Low Operating Voltage".
Xie et al, Appl. Phys. Lett. 60(16), Apr. 1992, pp. 1999–2001, "Room Temperature Blue Light Emitting p–n Diodes from Zn(S, Se)–based Multiple . . . ".
Search Report for European Appl. 94120788.8, mailed May 2, 1995.

(List continued on next page.)

Primary Examiner—Robert Kunemund
Attorney, Agent, or Firm—Renner, Otto, Boisselle & Sklar

[57] ABSTRACT

A crystal-growth method includes a process of filling three materials separately, one being selected from a group consisting of elemental Mg, MgS and MgSe compounds, and the other two being ZnSe and ZnS compounds, in their respective effusion cells, and a crystal-growth process of a $Zn_{1-Y}Mg_YS_ZSe_{1-Z}$ ($0<Y>1$ and $0<Z>1$) single-crystalline thin film on a heated substrate by controlling the temperatures of the effusion cells and the molecular beam intensities.

19 Claims, 8 Drawing Sheets

OTHER PUBLICATIONS

Meng et al., "Modified Hot Wall Epitaxy (HWE) Apparatus & Preparation of ZnSxSe$_{1-x}$ Films", 2300 Journal of Crystal Growth, #121 (1992) Jun., Nos. 1/2, pp. 191–196, Netherlands.

Wu et al, "Molecular Beam Epitaxial Growth of Col ZnS Using Elemental Sources", 320 Appl. Phys. Ltrs, 63 (1 993) 22 Nov., No. 21, N.Y., pp. 2935–2937.

Yoneda et al., "The Preparation of Conductive ZnS Films Bullsing MBE with A Single Effusin Lett Source", J. of Crystal Growth, vol. 67 (1984) pp. 125–134.

CRYSTAL-GROWTH METHOD AND SEMICONDUCTOR DEVICE PRODUCTION METHOD USING THE CRYSTAL-GROWTH METHOD

BACKGROUND OF THE INVENTION

1. Field of the Invention

The present invention relates to a method for growing a $Zn_{1-Y}Mg_YS_ZSe_{1-Z}$ (hereinafter, referred to as ZnMgSSe) single-crystalline thin film, a $ZnS_XSe_{1-X}$ (hereinafter, referred to as ZnSSe) single-crystalline thin film and a $Zn_{1-W}Cd_WSe$ (hereinafter, referred to as ZnCdSe) single-crystalline thin film, and a method for manufacturing a semiconductor device by using the above growth method.

2. Description of the Related Art

Figure 1:
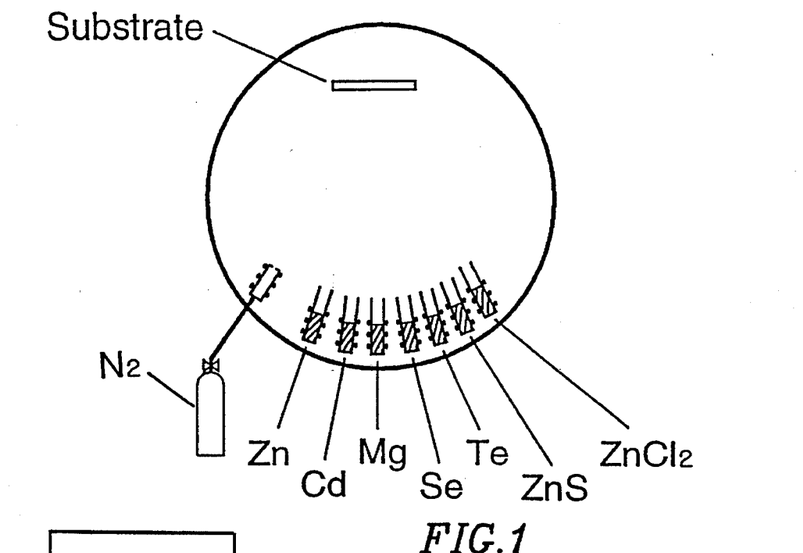
FIG. 1 is a schematic diagram showing the cross-section of the structure of the MBE apparatus in the conventional art.

ZnMgSSe, ZnSSe and ZnCdSe have been drawing attention as materials for a group II–V semiconductor laser which emits blue-green light. A single-crystalline semiconductor thin film made of these materials is formed by the molecular beam epitaxy (hereinafter, referred to as MBE) method. FIG. 1 shows a schematic construction of an MBE apparatus. Metals Zn, Cd, Mg, Se and Te, compounds ZnS and $ZnCl_2$, and $N_2$ gas are used for crystal growth in the MBE apparatus.

In growing ZnMgSSe single-crystalline thin film by the MBE method in The prior art, four independent effusion cells are each first filled with one of the four materials, elemental Zn, Mg, Se and polycrystalline ZnS (or elemental S) and then four kinds of molecular beams simultaneously irradiate upon the substrate from the effusion cells. The MBE apparatus is equipped with a pumping system, a substrate heating system, a plurality of effusion cells and a plasma cell, all of which are not shown in the figure. This kind of method for growing a single-crystalline thin film is disclosed in, for example, H. Okuyama et al. Journal of Crystal Growth Vol. 117, pp. 139–143 and S. Ito et al. Japanese Journal of Applied Physics Vol. 32, pp. L1530–L1532, 1993.

In growing a ZnSSe single-crystalline thin film by the MBE method, three independent effusion cells are each first filled with one of the three materials, elemental Zn, Se and polycrystalline ZnS and then three kinds of molecular beams simultaneously irradiates upon the substrate from the effusion cells. This kind of method for growing a single-crystalline thin film is disclosed in, for example, W. Xie et al. Applied Physics Letters Vol. 60, pp. 1999–2001, 1992.

In growing a ZnCdSe single-crystalline thin film to form a quantum well by the MBE method, three independent effusion cells are each filled with one of the three elemental Zn, Se and Cd and then three kinds of molecular beams simultaneously irradiates upon the substrate from the effusion cells. This kind of method for growing a single-crystalline thin film is disclosed in, for example, W. Xie et al. Applied Physics Letters Vol. 60, pp. 463–465, 1992.

The MBE method in the conventional art uses many effusion cells in a crystal-growth process. This is because, in order to obtain a single-crystalline thin film having excellent crystallinity, the molecular beam intensities of the component elements of the thin film need to be controlled independently from the others in order that an appropriate intensity ratio can be determined. Since the ratio of the molecule of a molecular beam attaching to the substrate and hence contributing to crystal growth varies depending on the component element, each molecular beam intensity needs to be adjusted. For example, in obtaining a GaAs single-crystalline thin film, the preferable intensity ratio of the As molecular beam to the Ga molecular beam (V/III ratio) is considered to be approximately between 10 and 20.

A problem with the MBE method in the prior art is that the alloy composition and the carrier density vary on the surface of the thin film and/or in the direction of its depth. They also vary according to the process of growing a thin film. Therefore, it is difficult to obtain, with good reproducibility, a single-crystalline thin film having uniform composition and carrier density. This problem has been an obstacle to producing, at a low cost, a device including a ZnMgSSe single-crystalline thin film, ZnSSe single-crystalline thin film or ZnCdSe single-crystalline thin film.

The present invention has been carried out to solve the above problem with the goal of providing a crystal-growing method for forming, with good reproducibility, a single-crystalline thin film having uniform composition and carrier density and a method for producing a semiconductor device by using the crystal-growth method.

SUMMARY OF THE INVENTION

A crystal-growth method of the present invention includes a process of filling three materials separately, one being selected from a group consisting of elemental Mg, MgS and MgSe compounds, and the other two being ZnSe and ZnS compounds, in their respective effusion cells, and a crystal-growth process of a $Zn_{1-Y}Mg_YS_ZSe_{1-Z}$ (0<Y<1 and 0<Z<1) single-crystalline thin film on a heated substrate by controlling the temperatures of the effusion cells and the molecular beam intensities to thereby achieve the above stated goal.

Another crystal-growth method of the present invention includes a process of filling two materials separately, one being selected from a group consisting of elemental Mg, MgS and MgSe compounds, and the other being a $ZnS_{X'}Se_{1-X'}$ (0<X'<1) alloy crystal, in their respective effusion cells, and a crystal-growth process of a $Zn_{1-Y}Mg_YS_ZSe_{1-Z}$ (0<Y<1 and 0<Z<1) single-crystalline thin film on a heated substrate by controlling the temperatures of the effusion cells and the molecular beam intensities to thereby achieve the above stated goal.

Another crystal-growth method of the present invention includes a process of filling a $Zn_{1-Y'}Mg_{Y'}S_{Z'}Se_{1-Z'}$ (0<Y'<1 and 0<Z'<1) alloy crystal in an effusion cell, and a crystal-growth process of a $Zn_{1-Y}Mg_YS_ZSe_{1-Z}$ single-crystalline thin film (0<Y<1 and 0<Z<1) on a heated substrate by controlling the temperature of the effusion cell and the molecular beam intensities to thereby achieve the above stated goal.

Preferably, crystal growth of a $Zn_{1-Y}Mg_YS_ZSe_{1-Z}$ (0.05≤Y≤0.15 and 0.10Z≤0.25) single-crystalline thin film is performed on a heated substrate by filling a $Zn_{1-Y'}Mg_{Y'}S_{Z'}Se_{1-Z'}$ (0.02≤Y'≤0.08 and 0.03≤Z'≤0.60) alloy crystal in the above effusion cell.

Another crystal-growth method of the present invention includes a process of filling ZnSe and ZnS compounds separately in their respective effusion cells, and a crystal-growth process of a $ZnS_XSe_{1-X}$ (0<X<1) single-crystalline thin film on a heated substrate by controlling the temperatures of the effusion cells and the molecular beam intensities to thereby achieve the above stated goal.

Another crystal-growth method of the present invention includes a process of filling a $ZnS_{X'}Se_{1-X'}$ (0<X'<1) alloy crystal in an effusion cell, and a crystal-growth process of a $ZnS_XSe_{1-X}$ (0<X<1) single-crystalline thin film on a heated substrate by controlling the temperature of the effusion cell and the molecular beam intensities to thereby achieve the above stated goal.

Preferably, a crystal growth of a $ZnS_xSe_{1-x}$ ($0.03 \leq X \leq 0.10$) single-crystalline thin film is performed on a heated substrate by filling a $ZnS_xSe_{1-x}$ ($0.08X'0.40$) mixed crystal in the above vaporization source cell.

Another crystal-growth method of the present invention includes a process of filling two materials separately, one being selected from a group consisting of elemental Cd and CdSe compounds, and the other being ZnSe compound, in their respective effusion cells, and a crystal-growth process of a $Zn_{1-w}Cd_wSe$ ($0<W<1$) single-crystalline thin film on a heated substrate by controlling the temperatures of the effusion cells and the molecular beam intensities to thereby achieve the above stated goal.

A crystal-growth method of the present invention includes a process of filling a $Zn_{1-w'}Cd_{w'}Se$ ($0<W'<1$) alloy crystal in an effusion cell, and a crystal-growth process of a $Zn_{1-w}Cd_wSe$ ($0<W<1$) single-crystalline thin film on a heated substrate by controlling the temperature of the effusion cell and the molecular beam intensities to thereby achieve the above stated goal.

Preferably, the above heated substrate temperature is set in the range between 100° C. and 400° C.

A method of the present invention for manufacturing a semiconductor device includes a process of forming a single-crystalline thin film according to a crystal-growth method described above.

Another method of the present invention for manufacturing a semiconductor device includes the steps of forming well layers made of a $Zn_{1-w}Cd_wSe$ ($0<W<1$) single-crystalline thin film by using the above crystal-growth method, and forming barrier layers made of a $ZnS_xSe_{1-x}$ ($0<X<1$) single-crystalline thin film by using the above crystal-growth method, thereby forming a multi quantum well structure.

Thus, the invention described herein makes possible the advantage of providing a crystal-growth method for forming, with good reproducibility, a single-crystalline thin film having uniform alloy composition and carrier density and a method for producing a semiconductor device by using the crystal-growth method.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of examples with reference to the accompanying drawings.

Figure 2:
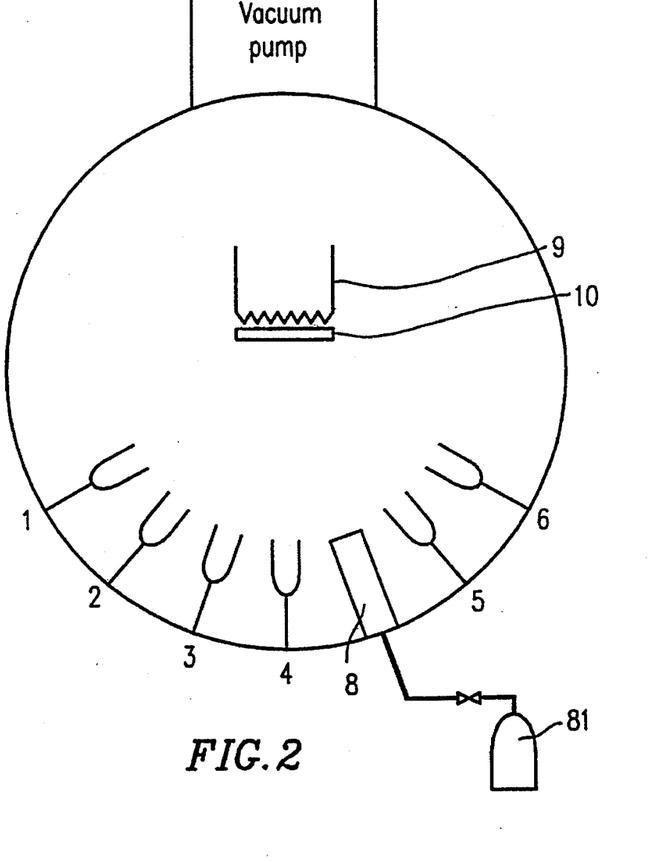
FIG. 2 is a schematic diagram showing the cross-section of the structure of the MBE apparatus used in this invention.

FIG. 2 shows a schematic diagram of an MBE apparatus according to the present invention which is used for forming a semiconductor thin film. ZnSe compound, CdSe compound, elemental Mg, ZnTe compound, ZnS compound, $ZnCl_2$ compound and $N_2$ gas are used as materials in the MBE apparatus of FIG. 2. The materials other than $N_2$ gas are used separately to fill up their respective effusion cells 1–6 installed in the MBE apparatus. $N_2$ gas is supplied from a cylinder 81 and is used for generating active nitrogen for p-type doping. Active nitrogen is obtained by electric discharge of nitrogen gas in a plasma cell 8. (See, for example, K. Ohkawa et al. Japanese Journal of Applied Physics Vol. 30, pp. L152–L155, 1991.) A substrate heating system 9 is installed in the MBE apparatus for heating and maintaining a substrate 10 at a constant temperature. The back pressure of the MBE apparatus is lowered to an order of $10^{-8}$ to $10^{-10}$ Torr. However the degree of vacuum inside the MBE apparatus at the time of p-type doping is in the range between $1 \times 10^{-5}$ and $1 \times 10^{-8}$ Torr because of the introduction of nitrogen gas.

Taking up ZnSe single-crystalline thin film growth as an example for simplicity reasons, the physical mechanism of the present invention is first explained hereinafter.

The crystal-growth method of the present invention uses ZnSe compound as a source material for growing a ZnSe single-crystalline thin film. Therefore, the ratio ($J_{Se}/J_{Zn}$: Flux Ratio) of the molecular beam intensity of Se ($J_{Se}$: the number of Se atoms per a second on an area of 1 cm$^2$ of the substrate) to the molecular beam intensity of Zn ($J_{Zn}$: the number of Zn atoms per a second on an area of 1 cm$^2$ of the substrate) is fixed at 1. In contrast to this, by using elemental Zn and Se to separately fill up effusion cells, the ratio ($J_{Se}/J_{Zn}$) of the molecular beam intensity of Se to the molecular beam intensity of Zn can be set at an arbitrary value.

Figures 9, 10, 11:
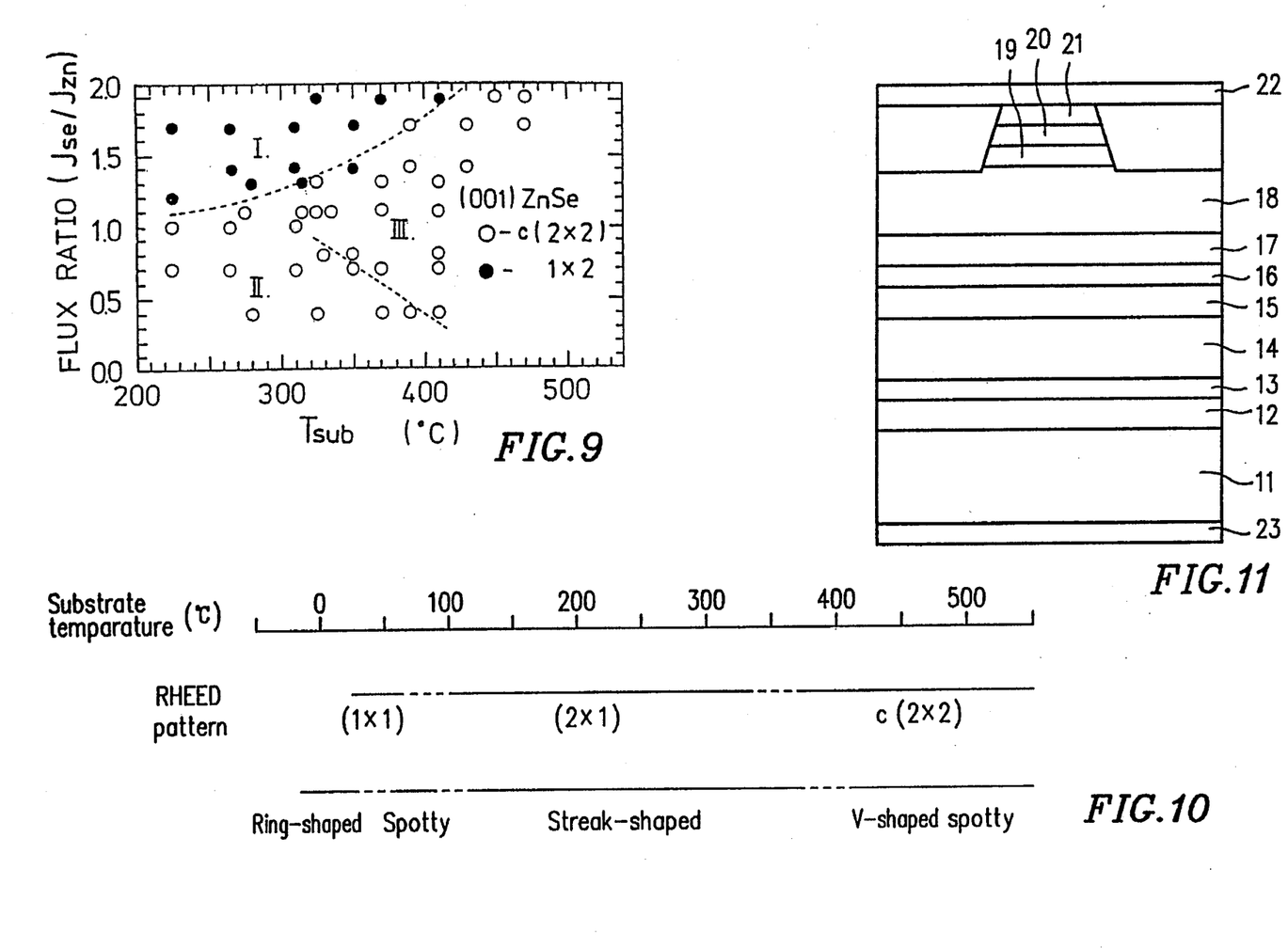
FIG. 9 is a graph showing the dependence of the RHEED pattern observed from a ZnSe thin film surface growing in the prior art, on the molecular intensity ratio ($J_{Se}/J_{Zn}$) and the substrate temperature.
FIG. 10 is a graph showing the dependence on the substrate temperature, of the RHEED pattern observed from a ZnSe thin film surface growing by the method of the present invention.
FIG. 11 is a drawing showing the cross-section of the structure of a semiconductor laser produced by the method of the present invention.

FIG. 9 shows The change in the surface structure of the thin film during crystal growth in relation to the ratio $J_{Se}/J_{Zn}$ and the substrate temperature when elemental Zn and Se are used separately for falling up the effusion cells. The graph shown in FIG. 9 is reported in K. Menda et al. Japanese Journal of Applied Physics Vol. 26, p. L1326, 1987.

In FIG. 9, The mark ○ represents a condition in which the reflection high-energy electron diffraction (RHEED) pattern is c(2×2) while the mark ● represents a condition in which the RHEED pattern is (1×2). The c(2×2) pattern means the group-II stabilized surface, and the (1×2) pattern means the group-VI stabilized surface. In regions I and III, the RHEED pattern is streak-shaped. In contrast, An region II, the RHEED pattern is streak-shaped at the initial stage of a growth process but changes spotty in the continuing growth process. A spotty or a V-shaped pattern means that the growing crystal has a rough surface. It is shown that a spotty c(2×2) RHEED pattern is observed in the region where the molecular beam intensity ratio is 1 and the substrate temperature is between 150° C. and 320° C. In this region, only a rough surface is obtained for the group-II stabilized surface. Device structures such as a laser structure require a smooth single-crystalline thin film. In addition, crystal growth with a relatively low temperature is desirable in view of lowering the resistivity of p-type. (See R. Park, Journal of Vacuum Science and Technology A Vol. 10, pp. 701–704, 1992.)

From above, it is known that region I provides a desirable growth. In order to realize growth in region I, it is necessary that the ratio ($J_{Se}/J_{Zn}$) be set to be greater than 1 and that the substrate temperature be maintained between 200° C. and 400° C. According to FIG. 9, a prediction is made that using the ZnSe compound as a material is not desirable for growing a ZnSe single-crystalline thin film, because the molecular beam intensity ratio is fixed at 1 when the ZnSe compound is used as a material.

However, according to an experiment by the inventors of the present invention, even when ZnSe compound is used, a streaky (2×1) RHEED pattern was observed and smooth crystalline growth was realized on the group-VI stabilized surface. FIG. 10 shows an outline of the result of the experiment. As stated above, even when ZnSe compound is used, despite the molecular beam intensity ratio $J_{Se}/J_{Zn}$ being fixed at 1, a streaky (2×1) RHEED pattern was observed at a substrate temperature of 100° C. and 320° C. From the experiment, it has also been discovered that the growth temperature suitable for the method of the present invention is in a range between 100° C. and 400° C. where no spotty or a V-shaped pattern is observed.

The reason for the deviation of the experimental result from the conventional prediction is interpreted as follows.

In the prior art, the molecular beam of Se has a composition where $Se_6:Se_5: Se_7:Se_2:Se_8=1:0.66:0.28:0.11:0.04$. This fact is reported, for example, in H. Cheng et al. Journal of Vacuum Science Technology B Vol. 8, pp. 181–186, 1990.

In contrast to this, when a mixed crystal compound AB containing a group-VI element B is used as a material for MBE, the compound sublimates as shown in the following equation before forming a molecular beam.

$$AB \rightarrow A + 1/2 B_2 \qquad (1)$$

where A=Zn, Cd, Mg, Hg (group-II elements) and B=S, Se, Te (group-VI elements). This is reported, for example, T. Yao, Researches of the Electrotechnical Laboratory No. 854, 1985, p.23. Therefore, according to the crystal growth method of this invention, group-VI elements form diatomic molecules. This diatomic molecule have high reactivity, since the molecules used in this invention are smaller that those used for a molecular beam in the prior art. As a result, even though the molecular beam intensity ratio is fixed at 1, an Se stabilized surface was realized as shown in FIG. 10.

In using the elemental Se as material, the molecular beam components are $Se_5$, $Se_2$, $Se_6$, $Se_7$ and $Se_3$ in the order of multitude when the effusion cell for Se is heated to a temperature of 600° C. (See, for example, H. Cheng et al. Journal of Vacuum Science Technology B Vol. 8, pp. 181–186, 1990.) However, $Se_2$ does not constitute the main component, contrary to the case where ZnSe compound is used as material. While the growth temperature for ZnSe can be lowered to 100° C. by heating the effusion cells both for metals Zn and Se to a high temperature (See, for example, M. Ohnishi et al. Journal of Crystal Growth Vol. 117, pp. 125–128, 1992), the method of the present invention, using compounds as material, has made it possible to further lower the growth temperature. This is considered to be because compound-sources are used at a several hundred degree higher temperature than elemental-sources and the main components of the molecular beams of group-VI are diatom molecules.

Since the composition and the carrier density of a single-crystalline semiconductor thin film are sensitive to changes in the molecular beam intensities, even a change in one of the molecular beams causes a change in the composition. Change in the ratio (VI/II ratio) of the molecular beam intensity of the group-VI elements (S and Se) to the molecular beam intensity of the group-II elements (Zn and Mg) affects the incorporation of donor-type or acceptor-type impurities, thus causing change in the carrier density. In view of this problem, fewer source materials lead to higher reproducibility of the composition and the carrier density, the better yield and, thus, lower production cost of the device.

The conventional art required many effusion cells resulting in a huge MBE apparatus and a high production cost. Decrease in the number of effusion cells makes a simple, easy and small MBE apparatus possible and thus contributes to a much lower production cost.

Examples of crystal-growth methods for a ZnMgSSe single-crystalline thin film, ZnSSe single-crystalline thin film and ZnCdSe single-crystalline thin film will now be described in detail hereinafter. In the following examples, each single-crystalline thin film was grown on a GaAs (100) substrate by using the MBE apparatus shown in FIG. 2. In the process of crystal growth, the substrate temperature was typically set at 280° C.

EXAMPLE 1

An n-type ZnMgSSe single-crystalline thin film was grown by using ZnSe and ZnS compounds and elemental Mg as material. Chlorine obtained from $ZnCl_2$ as a source material was used as an n-type dopant. (See, for example, K. Ohkawa et al. Journal of Applied Physics Vol. 62, pp. 3216–3221, 1987.)

Figure 3:
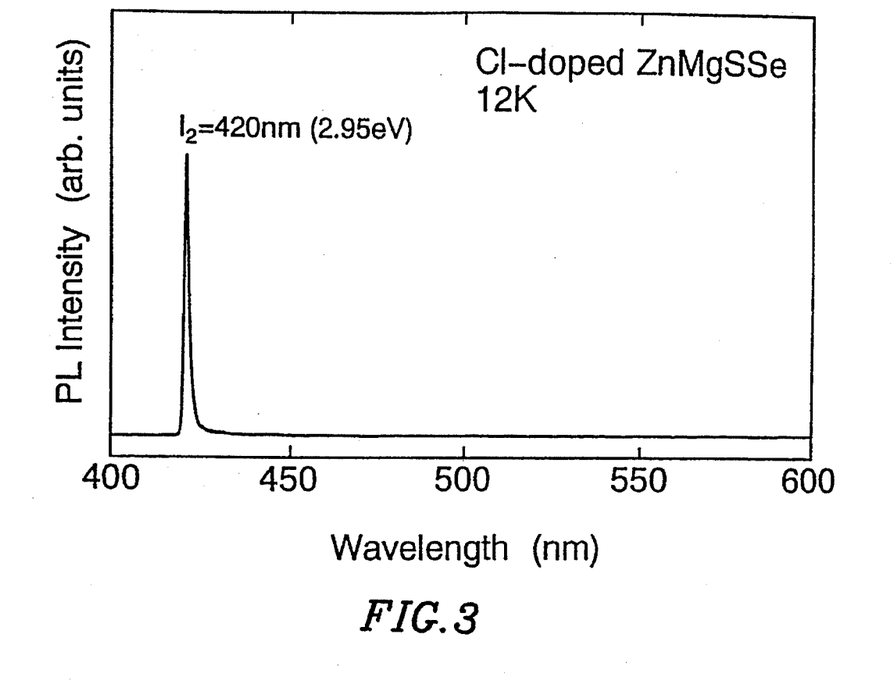
FIG. 3 is a graph showing the photoluminescence (PL) spectrum at 12K of a Cl-doped ZnMgSSe thin film.

FIG. 3 shows a photoluminescence (PL) spectrum observed from the n-type ZnMgSSe single-crystalline thin film grown in this example. The PL measurement was carried out at a temperature of 12K. A strong band-edge emission was observed at 420 nm. The origin of the luminescence is considered to be recombination emission of neutral-Cl-donor bound excitons ($I_2$). The band-gap energy of the ZnMgSSe thin film shown in FIG. 3 is 2.95 eV at 12K and approximately 2.85 eV at room temperature. Incidentally, in the present specification, the band-gap energy of the ZnMgSSe alloy crystal is defined as the photon energy of band-edge emission.

The lattice constant of $Zn_{1-Y}Mg_YS_ZSe_{1-Z}$ thin film is matched with that of GaAs and the composition obtained from the graph by Okuyama et al. (See FIGS. 1 and 3 in H. Okuyama et al. Journal of Crystal Growth Vol. 117, pp. 139–143, 1992) is Y=0.07 and Z=0.18. In order to obtain a $Zn_{1-Y}Mg_YS_ZSe_{1-Z}$ thin film with the above composition at a growth temperature of 280° C., the molecular beam intensities were set at P(ZnSe)=1.75×10$^{-6}$ Torr, P(ZnS)=9.0×10$^{-7}$ Torr and P(Mg)=2.5×10$^{-8}$ Torr. These molecular beam intensities were measured with a flux gage. The temperatures of the effusion cells were controlled so that the intensity of each molecular beam was maintained constant during the thin film growth. The growth rate of a ZnMgSSe thin film in the example was 0.63 μm/h. The RHEED pattern during the growth process was a mixture of (2×1) and c(2×2) and shows a fine streaky through the 1 μm growth from the initial stage to the final stage. Streaky RHEED pattern shows smoothness of the surface, verifying that the thin film exhibited a mirror surface. A ZnMgSSe thin film was obtained at a growth temperature between 100° C. and 400° C. With a low temperature substrate, the growth rate had to be lowered as compared to a high temperature substrate.

EXAMPLE 2

In this example, a $Zn_{1-Y}Mg_YS_ZSe_{1-Z}$ single-crystalline thin film was grown by using ZnSe, ZnS and MgS compounds as source materials.

The lattice constant of the obtained $Zn_{1-Y}Mg_YS_ZSe_{1-Z}$ thin film is 0.12% greater than that of GaAs. The crystallinity was good and the full width at half maximum (FWHM) measured by the double crystal X-ray diffraction method was 64 seconds. The band-gap energy of the single-crystalline thin film was 2.98 eV at 12K. The composition was Y=0.10 and Z=0.20. The molecular beam intensities for obtaining the above composition at a growth temperature of 280° C. were P(ZnSe)=1.25×10$^{-6}$ Torr, P(ZnS)=9.4×10$^{-7}$ Torr and P(MgS)=2.8×10$^{-8}$ Torr. The growth rate was 0.40 μm/h.

The RHEED pattern was a mixture of (2×1) and c(2×2), presenting a fine streak. The temperature for using MgS as material to obtain the above molecular beam, intensity (1,240° C.) is approximately 1,000° C. higher than that for elemental Mg (250° C.). Hence, the molecular beam intensity rapidly changes accordingly as the temperature of the effusion cell is changed. Therefore, by changing both molecular beam intensities of ZnS and MgS, a GRIN structure with gradual changes in band-gap can be realized while keeping lattice matched with GaAs.

When using the elemental Mg, Mg prone to oxidation, the surface of the metal is oxidized, with any remaining water and the like even in a vacuum. The oxidation inhibits the production of the molecular beam. The present example, using MgS compound instead of elemental Mg, is free from this problem.

EXAMPLE 3

In this example, a $Zn_{1-Y}Mg_YS_ZSe_{1-Z}$ single-crystalline thin film was grown by using ZnSe, ZnS and MgSe compounds as source materials.

The lattice constant of the obtained $Zn_{1-Y}Mg_YS_ZSe_{1-Z}$ film is identical with that of GaAs and the crystallinity was good. The band-gap energy was 2.96 eV at 12K. The composition of the thin film was Y=0.08 and Z=0.19. The molecular beam intensities for obtaining the above composition at a growth temperature of 280° C. were P(ZnSe)=1.55×10$^{-6}$ Torr, P(ZnS)=9.0×10$^{-7}$ Torr and P(MgSe)=2.5×10$^{-8}$ Torr and the growth rate was 0.50 μm/h.

During the growth, the RHEED pattern was a mixture of (2×1) and c(2×2), presenting a fine streak. The thin film exhibited a mirror surface.

Since the temperature for using MgSe as material (1,100° C.) is approximately 850° C. higher than that for the elemental Mg (250° C.), the molecular beam intensity rapidly changes accordingly as the temperature of the effusion cell is changed. Therefore, by changing both molecular beam intensities of ZnS and MgSe, a GRIN structure with gradual changes in band-gap can be realized while keeping lattice matched with GaAs.

The mole fraction Y of the $Zn_{1-Y}Mg_YS_ZSe_{1-Z}$ single-crystalline thin film was made larger by increasing the molecular beam intensity of Mg originated from one of the three materials, elemental Mg, MgS and MgSe compounds. In addition, the mole fraction Z was made larger by increasing the molecular beam intensity of ZnS. Therefore, it was possible to change the mole fractions of Mg and S within the range where 0<Y<1 and 0<Z<1.

Moreover, it was possible to maintain a constant molecular beam intensity of each of the four source materials, ZnS compound, elemental Mg, MgS and MgSe compounds by fixing the temperature of the corresponding effusion cell. However, maintaining a constant temperature of the effusion cell containing ZnSe did not guarantee a constant molecular beam intensity. Therefore, the molecular beam intensity was kept constant by increasing the temperature of the effusion cell at a gradient of 0.01° C./min.

EXAMPLE 4

In this example, a $Zn_{1-Y}Mg_YS_ZSe_{1-Z}$ single-crystalline thin film was grown by using elemental Mg and polycrystalline $ZnS_{X'}Se_{1-X'}$ (X'=0.50) alloy.

The lattice constant of the obtained thin film is identical with that of GaAs and the crystallinity was good. The band-gap energy was 2.94 eV at 12K. The composition was Y=0.065 and Z=0.17. The molecular beam intensities for obtaining the above composition at a growth temperature of 280° C. were P(ZnSSe)=2.50×10$^{-6}$ Torr and P(Mg)=2.3×10$^{-8}$ Torr and the growth rate was 0.55 μm/h. During the growth, the RHEED pattern was a mixture of (2×1) and c(2×2), presenting a fine streak. The mole fraction Y of the obtained $Zn_{1-Y}Mg_YS_ZSe_{1-Z}$ single-crystalline thin film depends on the growth temperature and the molecular beam intensity ratio P(Mg)/(P(ZnSSe)+P(Mg)). Because of this, it is hard to define generally, but a larger Y can be realized by adopting a higher growth temperature or a larger molecular beam intensity ratio. Conversely, a smaller Y can be realized by adopting a lower growth temperature or a smaller molecular beam intensity ratio. On the other hand, the mole fraction Z of the obtained $Zn_{1-Y}Mg_YS_ZSe_{1-Z}$ single-crystalline thin film depends on the growth temperature and the mole fraction X' of the polycrystalline $ZnS_{X'}Se_{1-X'}$ alloy used as a source material. Because of this, it is hard to define generally, but a larger Z can be realized by adopting a lower growth temperature or an alloy with a larger mole fraction X'. Conversely, a smaller Z can be realized by making the growth temperature higher or the mole fraction X' smaller. Therefore, it was possible to control the mole fractions Y and Z of the obtained $Zn_{1-Y}Mg_YS_ZSe_{1-Z}$ single-crystalline within the range where 0<Y<1 and 0<Z<1 by changing the growth temperature, the molecular beam intensity ratio and the mole fraction X' of the polycrystalline $ZnS_{X'}Se_{1-X'}$ alloy used as a source material.

The crystal growth of a $Zn_{1-Y}Mg_YS_ZSe_{1-Z}$ single-crystalline thin film is possible by replacing elemental Mg in the above example by either MgS compound or MgSe compound and by using the selected compound together with the polycrystalline $ZnS_{X'}Se_{1-X'}$ (0<X'<1) alloy. It was possible to control the mole fractions Y and Z within the range where 0<Y<1 and 0<Z<1 by changing the growth temperature, the molecular beam intensity ratio and the mole fraction X' of the alloy.

EXAMPLE 5

In this example, it is possible to produce a $Zn_{1-Y}Mg_YS_ZSe_{1-Z}$ (0<Y<1 and 0<Z<1) single-crystalline thin film by using the polycrystalline $Zn_{1-Y'}Mg_{Y'}S_{Z'}Se_{1-Z'}$ (0<Y'<1 and 0<Z'<1) alloy as a source material.

Although it is hard to define generally since the mole fractions Y and Z depend on the substrate temperature, the relations Y>Y' and Z<Z' exist. This is because the sticking coefficient of Mg is higher than that of Zn and the sticking coefficient of S is smaller than that of Se when the substrate temperature is in the range between 100° C. and 400° C.

A $Zn_{1-Y}Mg_YS_ZSe_{1-Z}$ single-crystalline thin film was grown on a substrate heated at a temperature between 250° C. and 350° C. by using a mixed crystal $Zn_{1-Y'}Mg_{Y'}S_{Z'}Se_{1-Z'}$ ($0.02 \leq Y' \leq 0.08$ and $0.30 \leq Z'0.60$). Although it is hard to define generally, since the composition of a $Zn_{1-Y}Mg_YS_ZSe_{1-Z}$ single-crystalline thin film depends on the substrate temperature, the composition lies in the range where $0.05 \leq Y \leq 0.15$ and $0.10 \leq Z \leq 0.25$. The band-gap energy of the ZnMgSSe thin film with the above composition is between 2.85 eV and 3.10 eV at 77K and the resistance can be lowered by doping of impurities. The obtained film has a lattice constant close to those of GaAs and ZnSe and hence has excellent crystallinity. Therefore, it is extremely important as a source material for constructing a device. Having made it possible to produce a ZnMgSSe single-crystalline thin film of one material, the present invention is a simple and easy method with high reproducibility.

EXAMPLE 6

Figure 4:
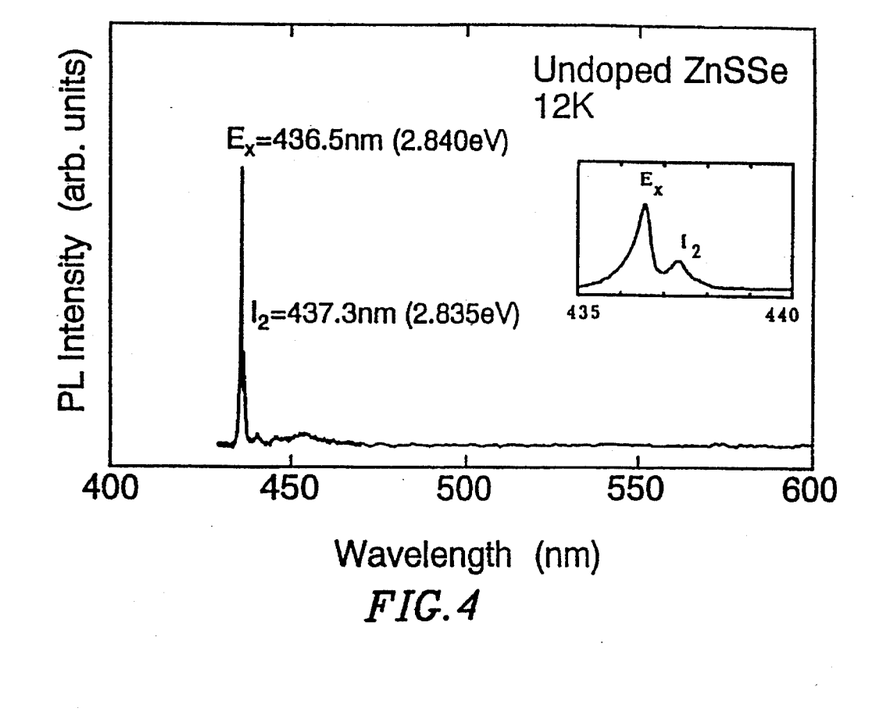
FIG. 4 is a graph showing the PL spectrum of a non-doped ZnZnSSe thin film at 12K.

In this example, a none-doped ZnSSe single-crystalline thin film was grown by using ZnSe and ZnS compounds as source materials. FIG. 4 shows the PL spectrum measured from the none-doped ZnSSe single-crystalline thin film. In the PL measurement at 12K, free exciton emission (Ex) is observed at 436.5 nm and $I_2$ emission at 437.3 nm. The dominant emission shows that the obtained ZnSSe thin film as well as ZnSe and ZnS compounds used as source materials were of high purity.

The mole fraction of the obtained $ZnS_XSe_{1-X}$ is X=0.065. One growth condition for obtaining the above mole fraction at a substrate temperature of 280° C. is P(ZnSe)=1.75×10⁻⁶ Torr and P(ZnS)=3.5×10⁻⁷ Torr. The mole fraction X depends on the substrate temperature and the molecular beam intensity ratio P(ZnS)/(P(ZnSe)+P(ZnS)). A higher substrate temperature gives a smaller mole fraction X and a greater molecular beam intensity ratio results in a greater mole fraction X. This means that P(ZnS) in the above molecular beam intensity ratio must be reduced when a growth temperature is lower than 280° C. N-type or p-type conduction is controlled by doping of chlorine or nitrogen into a growing ZnSSe.

EXAMPLE 7

In this example, a $ZnS_XSe_{1-X}$ single-crystalline thin film (0<X<1) was grown by using the $ZnS_{X'}Se_{1-X'}$ (0<X'<1) polycrystalline alloy.

Although it is hard to define generally, since the mole fraction X depends on the substrate temperature, the relation X<X' exists. This is because the sticking coefficient of S is smaller than that of Se at a substrate temperature between 100° C. and 400° C.

EXAMPLE 8

In this example, a $ZnS_XSe_{1-X}$ single-crystalline thin film was grown on a substrate heated at a temperature between 200° C. and 350° C. by using the $ZnS_{X'}Se_{1-X'}$ (0<X'<1) alloy with the molecular beam intensity P(ZnSSe)=2.0×10⁻⁶ Torr. Although it is hard to define generally since the composition of the obtained $ZnS_XSe_{1-X}$ single-crystalline thin film depends on the substrate temperature, it has been found out that the composition X exists in the range of $0.03 \leq X \leq 0.10$ in the example. The ZnSSe single-crystalline thin film with this composition has a lattice constant close to that of GaAs and hence excellent crystallinity. Therefore, it is extremely important as a source material for constructing a device. Having made it possible to produce a ZnSSe single-crystalline thin film of one material, the present invention is a simple and easy method with high reproducibility.

EXAMPLE 9

A laser structure was formed by successively growing a ZnMgSSe cladding layer (thickness: 1 μm), a ZnSSe light-guiding layer (thickness: 0.1 μm), a ZnCdSe active layer (thickness: approx. 20 nm or less), a ZnSSe light-guiding layer (thickness: 0.1 μm) and a ZnMgSSe cladding layer (thickness: 1 μm).

The obtained ZnSSe thin films and ZnMgSSe thin films are in lattice matched with the GaAs substrate. The ZnCdSe active layer has a lattice constant larger than that of GaAs and hence is not in lattice matched with the GaAs substrate. The thickness of the ZnCdSe thin film was made thin to the limit that it did not become defective. It is hard to define generally the minimum thickness of a $Zn_{1-W}Cd_WSe$ thin film without defect since it depends on the composition. However, it is approximately 20 nm or less.

The mole fraction W and room temperature band-gap energy (Eg) of the ZnCdSe thin film is defined by the following equation.

$$Eg(W)/[eV] = 2.635 - 1.235\,W + 0.30\,W^2 - (1.07+W)(0.04+W)/(7.22-W)/(14.89+W) \quad (2)$$

The value of Eg is adjusted to be equal to the energy of the laser oscillation wavelength. In equation (2), the thickness of the ZnCdSe thin film is assumed to be 5 nm or more and a blue shift of the laser oscillation caused by quantum effect is not considered.

Figure 5:
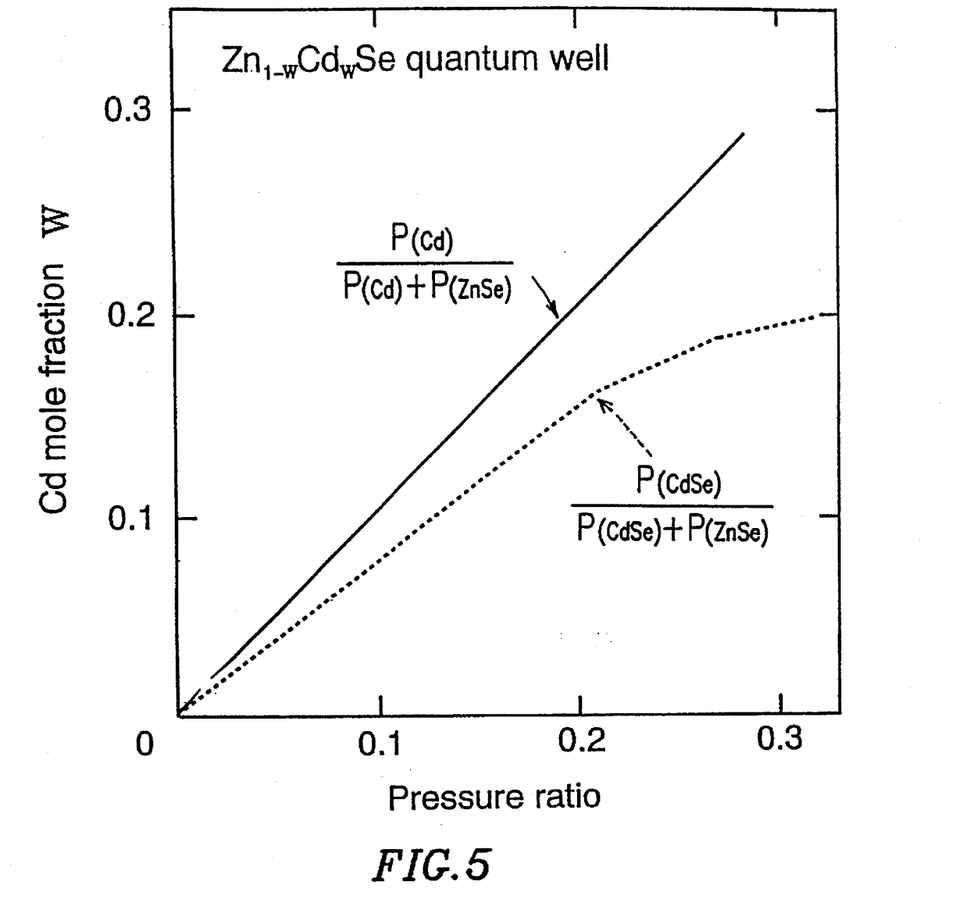
FIG. 5 is a graph showing the relation between the mole fraction W of the $Zn_{1-w}Cd_wSe$ thin film and the molecular beam intensity ratios, P(Cd)/(P(Cd)+P(ZnSe)) and P(CdSe)/(P(CdSe)+P(ZnSe)).

As shown in FIG. 5, the mole fraction W depends on the ratio between the intensities of the Cd related molecular beam and the molecular beam of ZnSe compound. In this example, crystal growth was carried out with the molecular beam intensity of ZnSe set at P(ZnSe)–1.75×10⁻⁶ Torr and the substrate temperature fixed at 280° C.

When elemental Cd and ZnSe compound are used, the mole fraction W changes linearly in the region of the molecular beam intensity ratio where P(Cd)/(P(Cd)+P(ZnSe))$\leq 0.2$. In the region where the molecular beam intensity ratio is 0.2 or more, the mole fraction W exhibits a saturation tendency because Cd and Zn compete against each other to take a group-II site. Therefore, according to the example, a ZnCdSe thin film with a mole fraction near W=0.2 is obtained with good reproducibility regardless of the change in the molecular beam intensities of the effusion cells.

Figure 6:
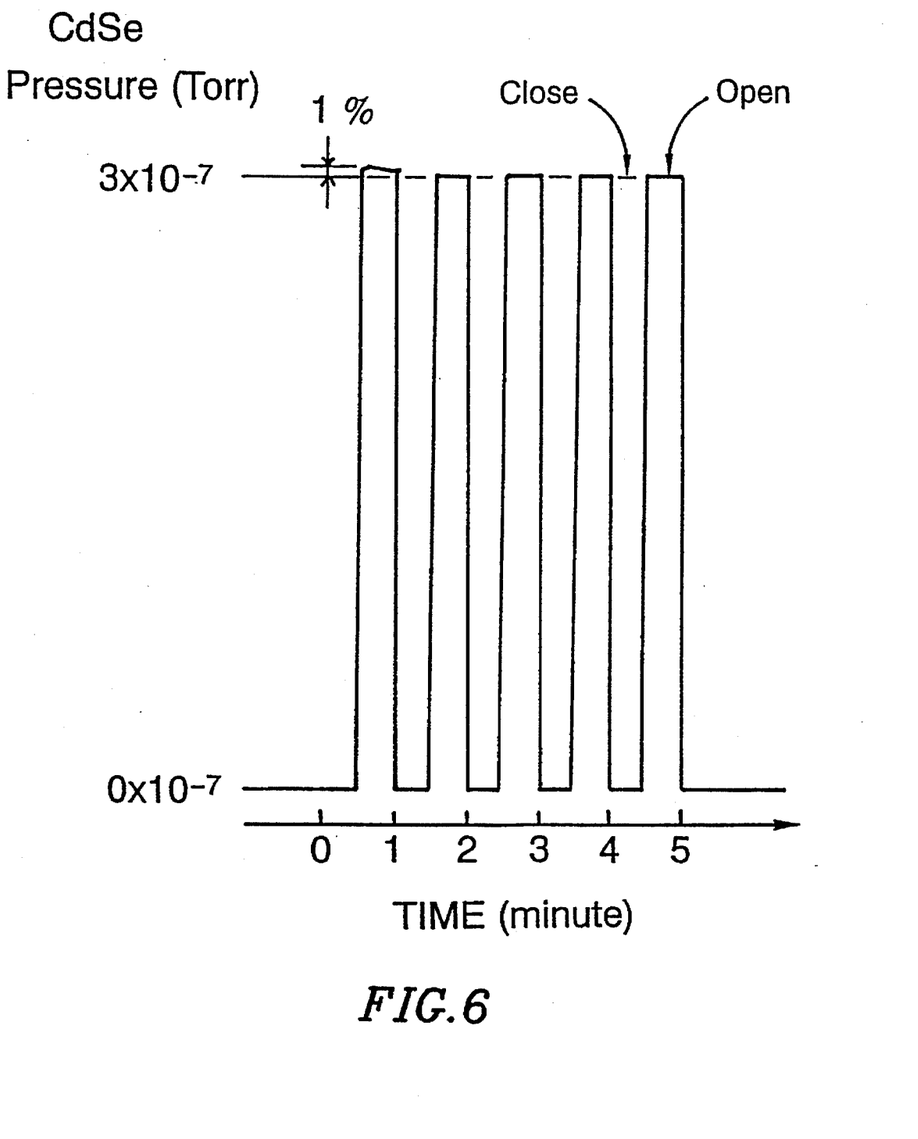
FIG. 6 shows the change in the molecular beam intensity of CdSe caused by the opening and closing of the shutter.

When CdSe and ZnSe compounds are used, the mole fraction W changes linearly at an arbitrary value of the molecular beam intensity ratio P(CdSe)/(P(CdSe)+ P(ZnSe)). Se being adequately supplied by a source material CdSe, there is no competition between Cd and Zn and hence the mole fraction W does not exhibit a saturation tendency. According to the method of the example, the mole fraction W of the ZnCdSe thin film is controlled freely by changing the above molecular beam intensity ratio. As to the molecular beam intensity of the CdSe compound, as shown in FIG. 6, the opening and closing of the cell shutter causes only a small burst of 1% off the stabilization intensity and the burst stabilizes within 1 minute. Therefore, this method is suitable for producing a multiple-quantum-well (MQW) structure, which requires introducing into an active layer a plurality of ZnCdSe thin films with the same composition.

In addition, a $Zn_{1-W}Cd_{W}Se$ single-crystalline thin film (0<W<1) was made by using the polycrystalline $Zn_{1-W'}Cd_{W'}Se$ (0<W'<1) alloy as a source material at a substrate temperature between 100° C. and 400° C. The mole fraction W was approximately equal to that of W'.

Figure 7:
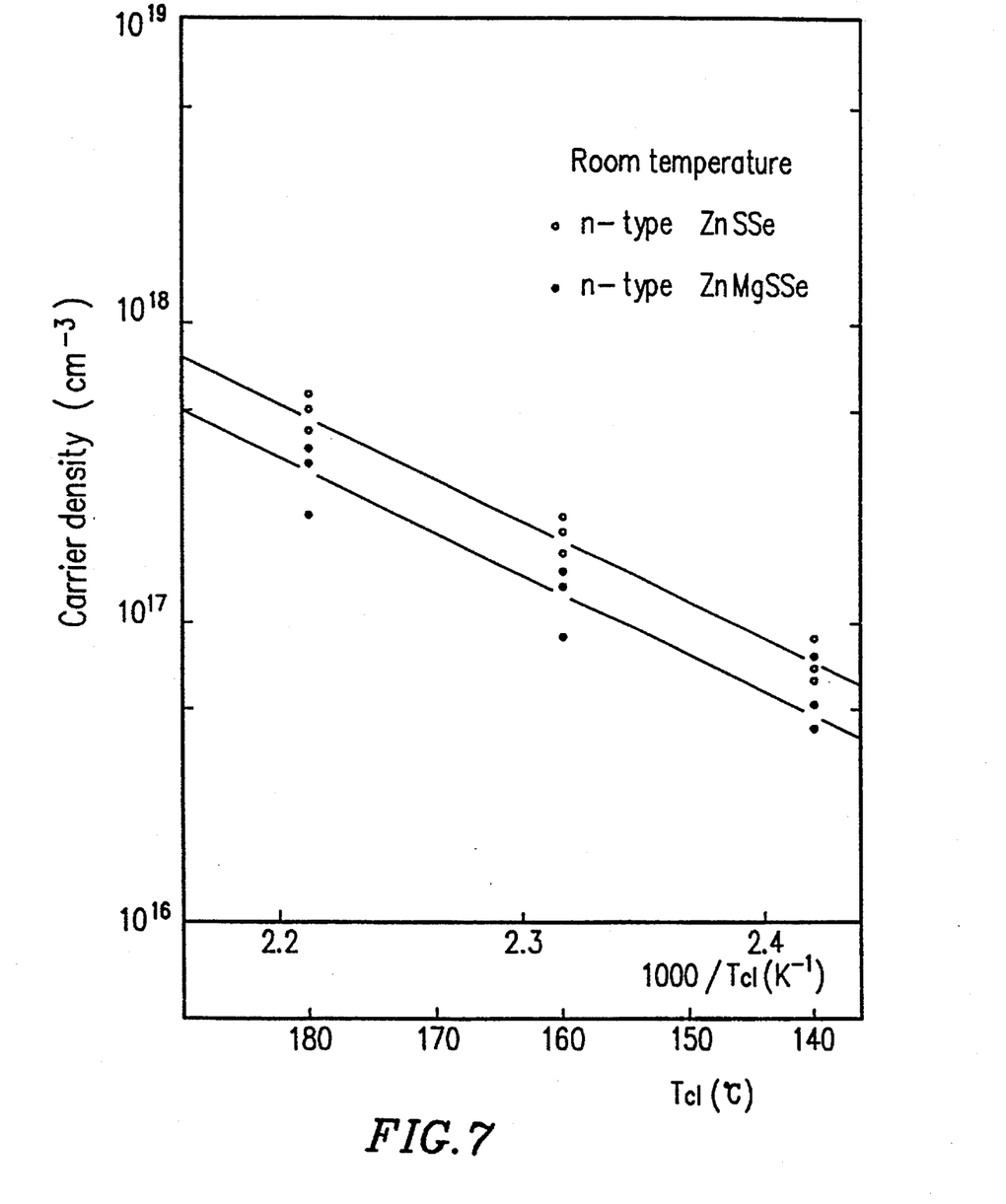
FIG. 7 is a graph showing the doping condition dependence of the carrier densities of an n-type ZnSSe thin film (marked with ○) and an n-type ZnMgSSe thin film (marked with ●) produced in the prior art.

FIG. 7 shows the doping condition dependence of the carrier density of two kinds of single-crystalline thin films: n-type $ZnS_XSe_{1-X}$ single-crystalline thin films (0.05<X<0.08) made of elemental Zn and Se and polycrystalline ZnS, and n-type $Zn_{1-Y}Mg_YS_ZSe_{1-Z}$ single-crystalline thin films (0.05<Y<0.08 and 0.13<Z<0.20) made of elemental Zn, Se and Mg and polycrystalline ZnS. The doping condition, in this context, refers to the temperature ($T_{cl}$) of the effusion cell filled with $ZnCl_2$.

Figure 8:
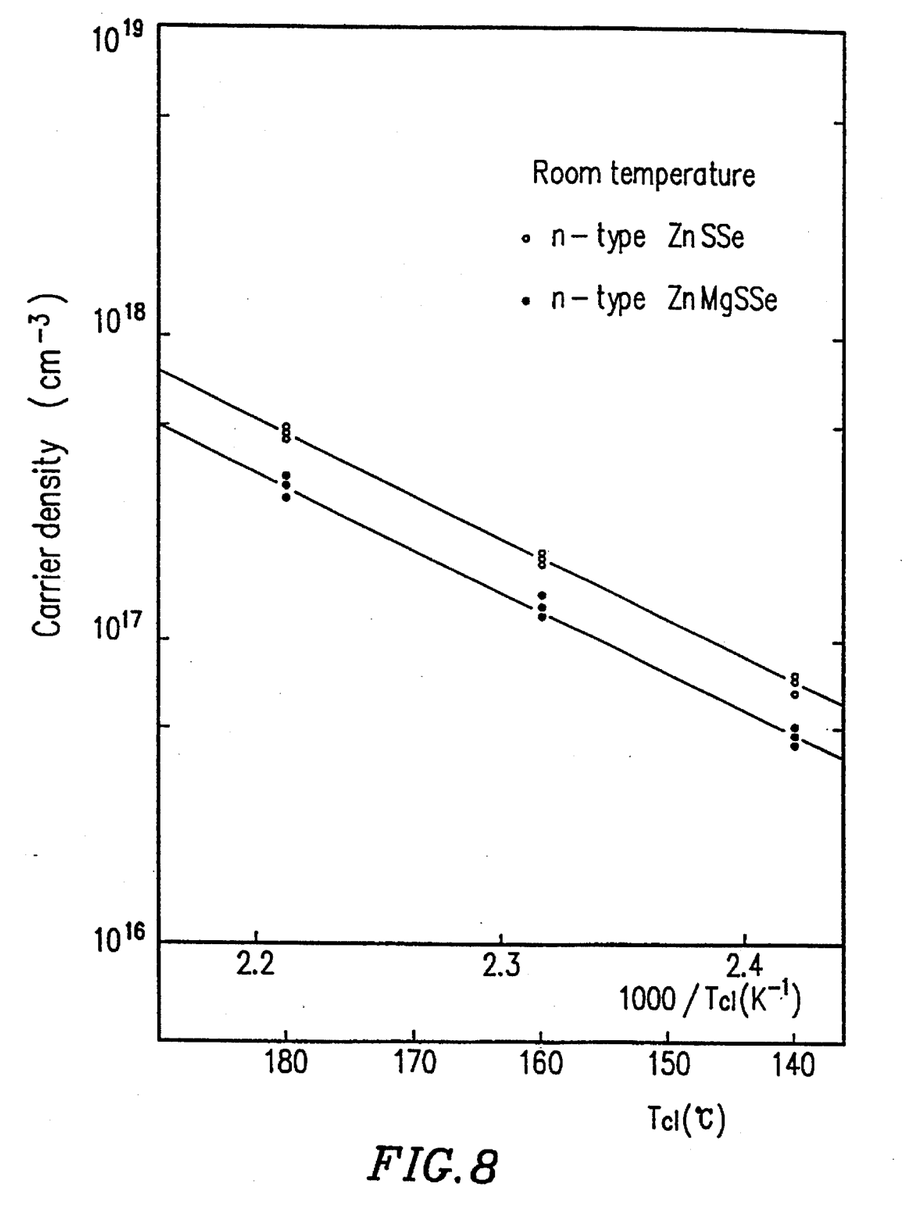
FIG. 8 is a graph showing the doping condition dependence of the carrier densities of an n-type ZnSSe thin film (marked with ○) and an n-type ZnMgSSe thin film (marked with ●) produced by the method of the present invention.

On the other hand, FIG. 8 shows the doping condition dependence of the carrier density of two kinds of single-crystalline thin films: n-type $ZnS_XSe_{1-X}$ single-crystalline thin films (0.05<X<0.08) made of ZnSe and ZnS compounds, and n-type $Zn_{1-Y}Mg_YS_ZSe_{1-Z}$ single-crystalline thin films (0.05<Y<0.08 and 0.15<Z<0.18) made of polycrystalline ZnSe, elemental Mg and polycrystalline ZnS. The doping condition, in this context, refers to the temperature ($T_{cl}$) of the effusion cell filled with $ZnCl_2$.

It is known that the thin films in FIG. 8 are smaller in the diversity of the carrier density than those in FIG. 7.

The lattice mismatch of the thin films with GaAs in FIG. 7 was between −0.2% and +0.2%, while that of the thin films in FIG. 7 was between −0.12% and +0.12%. The fact that the variation in the lattice constant is small shows that the variation in the composition is small. It has been found out that the crystal-growth method of the present invention can make the variation in the composition smaller, resulting in an extremely high reproducibility of the lattice constant and the carrier density. However, the variation in the composition caused by the change in the molecular beam intensity varies depending on the MBE apparatus. Although it is hard to specify the degree of the improvement because of the above reason, the method of the present invention is expected to realize a higher reproducibility than those in the conventional art.

Although description was made only about an n-type semiconductor doped with Cl, it is clear that the reproducibility of the carrier density can be improved with other donor impurities such as Ga, In, Al, Br and I. It is also clear that improvement can be made with the reproducibility of the carrier density of a p-type semiconductor doped with acceptor impurities by N, As and P.

EXAMPLE 10

A method for producing a semiconductor laser by using the crystal-growth method of the present invention will now be explained with reference to FIG. 11. In FIG. 11, a ZnMgSSe single-crystalline thin film, a ZnSSe single-crystalline thin film and a ZnCdSe single-crystalline thin film are used for cladding layers, light-guiding layers and an active layer respectively.

In the example, an MBE apparatus similar to the MBE apparatus shown in FIG. 2 was used. According to the conventional art, eight materials, elementals Zn, Se, Cd, Mg and Te, polycrystalline ZnS, nitrogen gas and $ZnCl_2$ are required. (See, for example, S. Itoh et al. Japanese Journal of Applied Physics Vol. 32, pp. L1530–L1532, 1993.) According to the method of the example, only seven materials are required as known from FIG. 2. The n-type and p-type carrier densities are controlled by Cl doping using $ZnCl_2$ and N doping using nitrogen plasma, respectively.

First, the following layers are epitaxially grown on an n-type GaAs substrate 11. That is, an n-type GaAs: Si buffer layer 12 (thickness: 0.45 μm, $N_d-N_a=2\times10^{18}$ cm$^{-3}$), an n-type ZnSe: Cl contact layer 13 (thickness: 30 nm, $N_d-N_a=6\times10^{17}$ cm$^{-3}$), an n-type ZnMgSSe: Cl cladding layer 14 (thickness: 0.8 μm, $N_d-N_a=4\times10^{17}$ cm$^{-3}$), an n-type ZnSSe: Cl light-guiding layer 15 (thickness: 85 nm, $N_d-N_a=1\times10^{17}$ cm$^{-3}$), a multi-quantum-well active layer 16 ($Zn_{0.65}Cd_{0.35}Se$ quantum well layers (well width: 2.4 nm, 4 layers), a ZnSSe barrier layers (width: 3.4 nm, 3 layers)), a p-type ZnSSe: N light guiding layer 17 (thickness: 85 nm, $N_a-N_d=1\times10^{17}$ cm$^{-3}$), a p-type ZnMgSSe: N cladding layer 18 (thickness: 0.8 μm, $N_a-N_d=3\times10^{17}$ cm$^{-3}$), a p-type ZnSe: N contact layer 19 (thickness: 40 nm, $N_a-N_d=1\times10^{18}$ cm$^{-3}$), a p-type ZnSe: N/ZnTe: N super lattice contact layer 20 (thickness: 2 nm each, 20 periods, $N_a-N_d=1\times10^{18}$ cm$^{-3}$), a p-type ZnTe: N contact layer 21 (thickness: 37 nm, $N_a-N_d=2\times10^{19}$ cm$^{-3}$). Preferably, these epitaxical growths are carried out successively in a system which connects, through a vacuum tube, an MBE apparatus for growing GaAs buffer layers and an MBE apparatus for growing group II–VI semiconductor layers. The source materials for a ZnSe layer and a ZnTe layer are polycrystalline ZnSe and ZnTe, respectively. The source materials for a ZnMgSSe layer are polycrystalline ZnSe and ZnS, and elemental Mg. The source materials for a ZnSSe layer are polycrystalline ZnSe and ZnS. The source materials for a ZnCdSe layer are polycrystalline ZnSe and CdSe. The ZnMgSSe thin films and the ZnSSe thin films formed in this way are in lattice matched with the GaAs substrate 1. The band-gap energy of the ZnMgSSe thin film is 2.83 eV at room temperature.

Next, p-type contact layers 19–21 are chemically etched in stripe shape patterned by photolithography. After filling the concave portions formed by etching with insulating material, an Au electrode 22 is formed by vacuum vaporization. An In electrode 23 is formed on the back of the substrate 21. Thus, a gain-guided electrode-stripe semiconductor laser is obtained. A resonator of the semiconductor laser is formed by cleavage.

Figure 12:
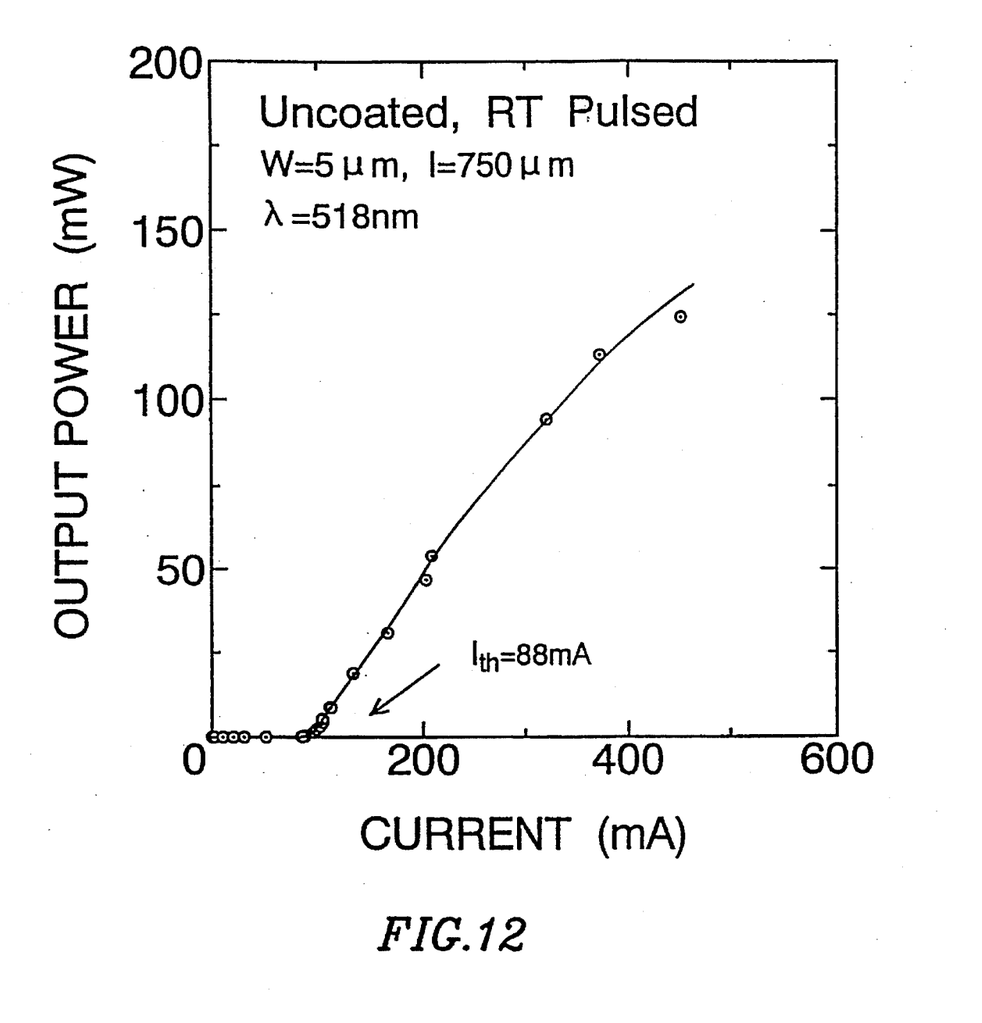
FIG. 12 is a graph showing light output power-current characteristics of the semiconductor laser shown in FIG. 11.

By applying a pulse voltage of approximately 13 V between the Au electrode 22 and In electrode 23 of the semiconductor laser shown in FIG. 11, a current of approximately 88 mA was injected and a laser beam with a wavelength of approximately 518 nm was created. The measurement was carried out at room temperature. As shown in FIG. 12, the light output exceeded 100 mW at one end facet. This proves that the method of the present invention provides adequate crystallinity since the ZnMgSSe cladding layers, the ZnSSe light-guiding layers and the ZnCdSe active layers are required to have adequate crystallinity for laser oscillation. Several semiconductors with the same structure were produced and their threshold voltages shown the same value, which confirms good reproducibility of the method of the present invention. Incidentally, the Cd mole fraction of the active layer is W=0.35 and because of a blue shift owing to a small well width of 2.4 nm, laser oscillation was observed at 518 nm, a wavelength shorter than 555 nm which is expected from equation (2).

ZnSe, ZnTe, ZnS and CdSe compounds, and elemental Mg were mainly used as source materials in the example. However, the present invention is not limited to these materials. That is to say, a ZnMgSSe single-crystalline thin film can be grown with good reproducibility by using ZnSe and ZnS compounds together with one of the two MgS and MgSe compounds, by using ZnSSe alloy and one of the three materials, elemental Mg, MgS and MgSe compounds or by using only ZnMgSSe alloy. A ZnSSe single-crystalline thin film can be grown with good reproducibility by using ZnSSe compound as source material. A ZnCdSe single-crystalline thin film can be grown with good reproducibility by using elemental Cd and ZnSe compound as a source material or by using only a ZnCdSe alloy.

As stated above, the present invention makes it possible to realize crystal growth of a ZnMgSSe single-crystalline thin film, a ZnSSe single-crystalline thin film and a ZnCdSe single-crystalline thin film with high reproducibility in respect to the composition and the carrier density at a low cost and thus provides the production of a device of these materials with high reproducibility at a low cost.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A crystal-growth method comprising the steps of:
   filling three materials separately, one being selected from a group consisting of elemental Mg, MgS and MgSe compounds, and the other two being ZnSe and ZnS compounds, in their respective effusion cells, and
   growing a $Zn_{1-Y}Mg_YS_ZSe_{1-Z}$ (0<Y<1 and 0<Z<1) single-crystalline thin film on a heated substrate by controlling the temperatures of the effusion cells and the molecular beam intensities.

2. A crystal-growth method comprising the steps of:
   filling two materials separately, one being selected from a group consisting of elemental Mg, MgS and MgSe compounds, and the other being a $ZnS_{X'}Se_{1-X'}$ (0<X'<1) alloy in their respective effusion cells, and
   growing a $Zn_{1-Y}Mg_YS_ZSe_{1-Z}$ (0<Y<1 and 0<Z<1) single-crystalline thin film on a heated substrate by controlling the temperatures of the effusion cells and the molecular beam intensities.

3. A crystal-growth method comprising the steps of:
   filling a $Zn_{1-Y'}Mg_{Y'}S_{Z'}Se_{1-Z'}$ (0<Y'<1 and 0<Z'<1) alloy in an effusion cell, and
   growing a $Zn_{1-Y}Mg_YS_ZSe_{1-Z}$ (0<Y<1 and 0<Z<1) single-crystalline thin film on a heated substrate by controlling the temperature of the effusion cell and the molecular beam intensity.

4. A crystal-growth method according to claim 3, wherein a $Zn_{1-Y}Mg_YS_ZSe_{1-Z}$ (0.05≦Y≦0.15 and 0.10≦Z≦0.25) single-crystalline thin film is grown on a heated substrate by filling a $Zn_{1-Y'}Mg_{Y'}S_{Z'}Se_{1-Z'}$ (0.02Y'≦0.08 and 0.30≦Z'≦0.60) polycrystalline alloy in the above effusion cell.

5. A crystal-growth method comprising the steps of:
   filling ZnSe and ZnS compounds separately in their respective effusion cells, and
   growing a $ZnS_XSe_{1-X}$ (0<X<1) single-crystalline thin film on a heated substrate by controlling the temperatures of the effusion cells and the molecular beam intensities.

6. A crystal-growth method comprising the steps of:
   filling a $ZnS_{X'}Se_{1-X'}$ (0<X'<1) alloy in an effusion cell, and
   growing a $ZnS_XSe_{1-X}$ (0<X<1) single-crystalline thin film on a heated substrate by controlling the temperature of the effusion cell and the molecular beam intensity.

7. A crystal-growth method according to claim 6, wherein a $ZnS_XSe_{1-X}$ (0.03≦X≦0.10) single-crystalline thin film is grown on a heated substrate by filling a $ZnS_{X'}Se_{1-X'}$ (0.08≦X≦0.40) polycrystalline alloy in an effusion cell.

8. A crystal-growth method comprising the steps of:
   filling two materials separately, one being selected from a group consisting of elemental Cd and CdSe compound, and the other being ZnSe compound, in their respective heating effusion cells and
   growing a $Zn_XCdSe_{1-X}$ (0<X<1) single-crystalline thin film on a heated substrate by controlling the temperatures of the effusion cells and the molecular beam intensities.

9. A crystal-growth method comprising the steps of:
   filling a $Zn_{1-W'}Cd_{W'}Se$ (0<W'<1) alloy in an effusion cell, and
   growing a $Zn_{1-W}Cd_WSe$ (0<W<1) single-crystalline thin film on a heated substrate by controlling the temperature of the effusion cell and the molecular beam intensity.

10. A crystal-growth method according to claim 1, wherein the above heated substrate temperature is set in the range between 100° C. and 400° C.

11. A method for manufacturing a semiconductor device comprising a process of forming a single-crystalline thin film by a crystal-growth method according to claim 1.

12. A method for manufacturing a semiconductor device comprising the steps of:
   forming well layers made of $Zn_{1-W}Cd_WSe$ (0<W<1) single-crystalline thin films by using a crystal-growth method according to claim 8; and
   forming barrier layers made of $ZnS_XSe_{1-X}$ (0<X<1) single-crystalline thin films by using a crystal-growth method comprising the steps of filling ZnSe and ZnS compounds separately in their respective effusion cells, and growing a $ZnS_XSe_{1-X}$ (0<X<1) single-crystalline thin film on a heated substrate by controlling the temperatures of the effusion cells and the molecular beam intensities, thereby forming a multi-quantum-well active layer.

13. A method for manufacturing a semiconductor device comprising the steps of:
   forming well layers made of $Zn_{1-W}Cd_WSe$ (0<W<1) single-crystalline thin films by using a crystal-growth method according to claim 9; and
   forming barrier layers made of $ZnS_XSe_{1-X}$ (0<X<1) single-crystalline thin films by using a crystal-growth method comprising the steps of filling ZnSe and ZnS compounds separately in their respective effusion cells, and growing a $ZnS_xSe_{1-x}$ (0<X<1) single-crystalline thin film on a heated substrate by controlling the temperatures of the effusion cells and the molecular beam intensities, thereby forming a multi-quantum-well active layer.

14. A method for manufacturing a semiconductor device comprising the steps of:

forming well layers made of $Zn_{1-W}Cd_WSe$ (0<W<1) single-crystalline thin films by using a crystal-growth method according to claim 8; and forming barrier layers made of $ZnS_xSe_{1-x}$ (0<X<1) single-crystalline thin films by using a crystal-growth method comprising the steps of filling a $ZnS_{x'}Se_{1-x'}$ (0<X'<1) alloy in an effusion cell, and growing a $ZnS_xSe_{1-x}$ (0<X<1) single-crystalline thin film on a heated substrate by controlling the temperature of the effusion cell and the molecular beam intensity, thereby forming a multi-quantum-well active layer.

15. A method for manufacturing a semiconductor device comprising the steps of:

forming well layers made of $Zn_{1-W}Cd_WSe$ (0<W<1) single-crystalline thin films by using a crystal-growth method according to claim 9; and forming barrier layers made of $ZnS_xSe_{1-x}$ (0<X<1) single-crystalline thin films by using a crystal-growth method comprising the steps of filling a $ZnS_{x'}Se_{1-x'}$ (0<X'<1) alloy in an effusion cell, and growing a $ZnS_xSe_{1-x}$ (0<X<1) single-crystalline thin film on a heated substrate by controlling the temperature of the effusion cell and the molecular beam intensity, thereby forming a multi-quantum-well active layer.

16. A crystal-growth method according to claim 2 wherein the above heated substrate temperature is set in the range between 100° C. and 400° C.

17. A crystal-growth method according to claim 3 wherein the above heated substrate temperature is set in the range between 100° C. and 400° C.

18. A method for manufacturing a semiconductor device comprising a process of forming a single-crystalline thin film by a crystal-growth method according to claim 2.

19. A method for manufacturing a semiconductor device comprising a process of forming a single-crystalline thin film by a crystal-growth method according to claim 3.

* * * * *

UNITED STATES PATENT AND TRADEMARK OFFICE
CERTIFICATE OF CORRECTION

PATENT NO.    : 5,492,080

DATED         : February 20, 1996

INVENTOR(S)   : Kazuhiro Ohkawa et al

It is certified that error appears in the above-identified patent and that said Letters Patent is hereby corrected as shown below:

Title page, item [57]
Abstract [57]:

Page 1, line 6, change "($0<Y>1$ and $0<Z>1$)" to --($0<Y<1$ and $0<Z<1$)--.

Column 2, line 52, change "$0.10Z \leq 0.25$)" to --$0.10 \leq Z \leq 0.25$)--.

Column 3, line 5, change "($0.08X'0.40$)" to --($0.08 \leq X' \leq 0.40$)--.

Column 5, line 60, change "A-Zn," to --A=Zn,--.

Column 10, line 62, change "P(ZnSe)-$1.75 \times 10^{-6}$" to --P(ZnSe) = $1.75 \times 10^{-6}$--.

Column 12, line 37, change "$N_{a-Nd} = 1 \times 10^{18}$ cm$^{-3}$" to --$N_a - N_d = 7 \times 10^{17}$ cm$^{-3}$--.

Col. 13, Claim 3, line 65, change "$Zn_{1-Y}Mg_{Y'}S_{Z'}Se_{1-Z'}$" to --$Zn_{1-Y}Mg_Y S_Z Se_{1-Z}$--.

Col. 14, Claim 4, line 6, change "($0.02Y' \leq 0.08$" to --($0.02 \leq Y' \leq 0.08$--.

UNITED STATES PATENT AND TRADEMARK OFFICE
CERTIFICATE OF CORRECTION

PATENT NO. : 5,492,080

DATED : February 20, 1996

INVENTOR(S) : Kazuhiro Ohkawa et al

It is certified that error appears in the above-identified patent and that said Letters Patent is hereby corrected as shown below:

Col. 16, Claim 16, line 10, change "2 wherein" to --2, wherein--.

Col. 16, Claim 17, line 1, change "3 wherein" to --3, wherein--.

Signed and Sealed this

Eleventh Day of February, 1997

BRUCE LEHMAN

Attest:

Attesting Officer

Commissioner of Patents and Trademarks